United States Patent [19]

Ham

[11] Patent Number: 5,567,552
[45] Date of Patent: Oct. 22, 1996

[54] METHOD FOR FABRICATING A PHASE SHIFT MASK

[75] Inventor: Young Mok Ham, Seoul, Rep. of Korea

[73] Assignee: Hyundai Electronics Industries, Kyungki-do, Rep. of Korea

[21] Appl. No.: 401,223

[22] Filed: Mar. 9, 1995

[30] Foreign Application Priority Data

Mar. 11, 1994 [KR]   Rep. of Korea .................. 94-4785

[51] Int. Cl.⁶ .................................................. G03F 9/00
[52] U.S. Cl. ................... 430/5; 430/322; 430/323; 430/324; 216/12
[58] Field of Search .......................... 430/5, 322, 323, 430/324; 156/625

[56] References Cited

U.S. PATENT DOCUMENTS 5,358,827  10/1994  Garofalo et al. ................. 430/313
5,405,721   4/1995  Pierrat ............................. 430/5
5,411,824   6/1994  Vasudev et al. .................. 430/5

Primary Examiner—S. Rosasco
Attorney, Agent, or Firm—Fish & Richardson P.C.

[57] ABSTRACT

A method for fabricating a phase shift mask is disclosed. In order to make the phase shift mask, an etching groove is formed on the light shielding portion of the quartz substrate and chrome is then formed on the center portion of the etching groove. The phase shift mask produces a phase shift effect without using phase shift materials, thereby increasing the optical contrast.

4 Claims, 3 Drawing Sheets

5,567,552

METHOD FOR FABRICATING A PHASE SHIFT MASK

FIELD OF THE INVENTION

This invention relates to a method for fabricating a phase shift mask, more particularly, to a method for fabricating a phase shift mask in a such way that a phase shift of 180 degrees is created at an etching surface consisting of a boundary between a light transparent portion and a light shielding portion. Such phase shift mask is formed by etching the light shielding portion of a quartz substrate to form an etching groove and by forming a chrome region on the etching groove.

INFORMATION DISCLOSURE STATEMENT

A phase shift mask creates multiple phase shifts by utilizing the phenomenon of light interference between the light transmitted to phase shift materials and the light transmitted to the quartz substrate which are not coated with phase shift materials, thereby increasing the resolution. Such phase shift mask for creating multiple phase shifts is broadly used in the semiconductor device manufacturing process together with a conventional mask which do not create phase shifts.

Generally, the phase shift mask uses phase shift materials such as an oxide to create the phase shift. However, the main problem of phase shift mask using phase shift materials is the difficulty in performing lay-out design. Also, the phase shift mask deteriorates the transmitted light power caused by the phase shift materials, thereby causing some deterioration in optical contrast when subjected to deep ultraviolet having a short wavelength.

Therefore, it is an object of the present invention to provide a method for fabricating a phase shift mask which can obtain to the same effect as that of a conventional phase shift mask not using the phase shift materials and which can increase optical contrast.

SUMMARY OF THE INVENTION

The method for fabricating a phase shift mask of the present invention is defined by the claims with a specific embodiment shown in the attached drawings. For the purpose of summarizing the invention, the invention relates to a method of fabricating a phase shift mask, comprising the steps of: forming a first photoresist pattern on a quartz substrate so as to divide such pattern into a light transparent portion and a light shielding portion; etching the quartz substrate exposed by the first photoresist pattern, thereby forming an etching groove; removing the first photoresist pattern and forming a spacer on the side wall of the etching groove; depositing chrome on the resulting structure including the quartz substrate and the bottom of said etching groove; removing the spacer and coating a photoresist on the resulting structure including the surface of the quartz substrate and the etching groove; performing an etch back process to form a second photoresist pattern on the groove; etching the chrome exposed by the etch back process; and removing the second photoresist pattern to leave the chrome on the bottom of the etching groove.

BRIEF DESCRIPTION OF THE DRAWINGS

For a full understanding of the nature and objects of the present invention, reference should be made to the following detailed descriptions made in conjunction with the accompanying drawings in which.

Similar reference characters refer to similar parts through the several views of the drawings.

DETAILED DESCRIPTION OF TEE INVENTION

FIG. 1A through FIG. 1F are cross sectional views illustrating the process of manufacturing a phase shift mask according to the present invention.

Figure 1A:
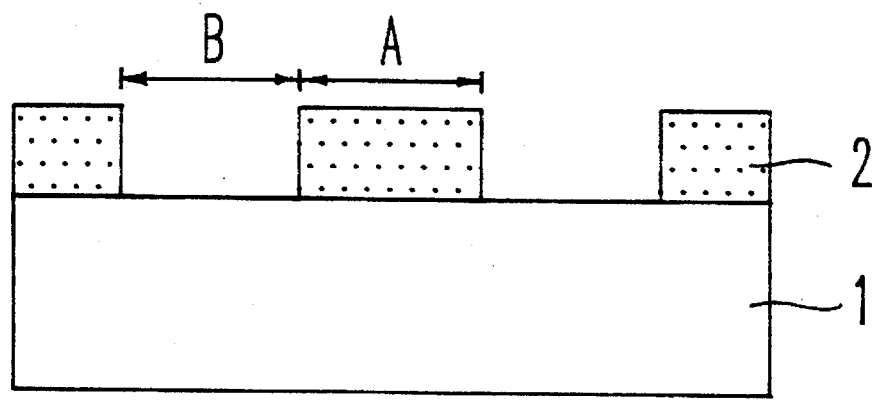
FIG. 1A through FIG. 1F are cross sectional views illustrating the process of manufacturing a phase shift mask according to the present invention.

Referring to FIG. 1A, a first photoresist pattern 2 is formed on a quartz substrate 1 by means of a lithography process, thereby separating into a light transparent portion A and a light shielding portion B.

The remaining photoresist portion becomes the light transparent portion A of a phase shift mask while the exposed portion of the substrate becomes the light shielding portion B of the phase shift mask.

Figure 1B:
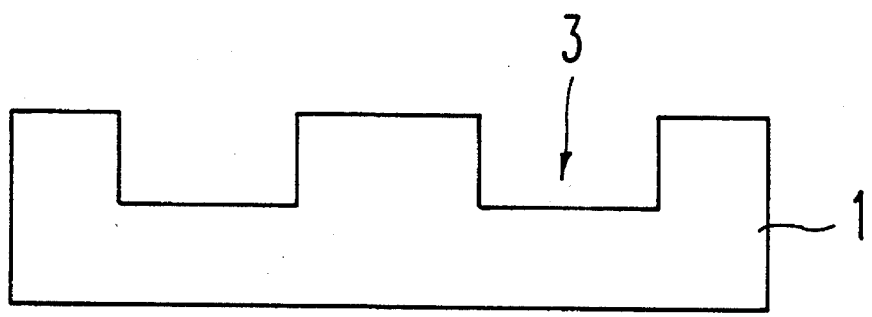

Referring to FIG. 1B, the light shielding portion B exposed by the first photoresist pattern 2 is etched by means of an anisotropic etching process so as to form an etching groove 3 and the first photoresist pattern 2 is then removed.

Figure 1C:
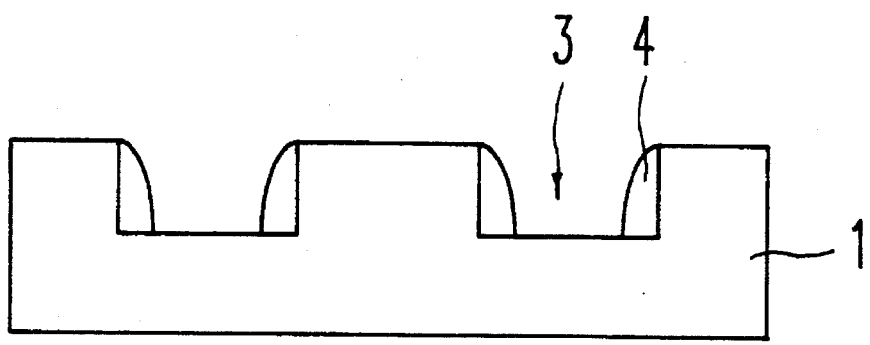

Referring to FIG. 1C, a material of the etching selectivity of which varies from that of the quartz substrate 1, for example nitride or polysilicon, is deposited on the quartz substrate 1 including the etching groove 3 and a blanket etching process is then performed, thereby forming spacers 4 on the side walls of the etching groove 3.

Figure 1D:
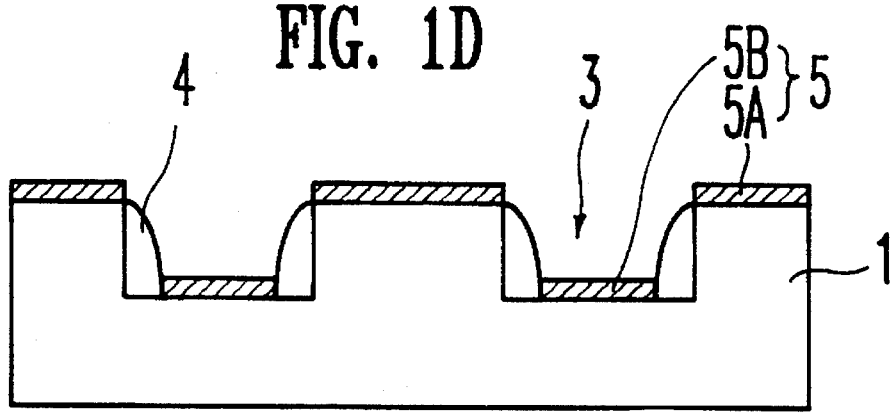

Referring to FIG. 1D, chrome 5 is deposited on the bottom of the etching groove 3 and the surface of the quartz substrate 1. The chrome 5 is divided into two regions the upper chrome region 5A and the lower chrome region 5B, such regions being separated by the spacers 4.

Figure 1E:
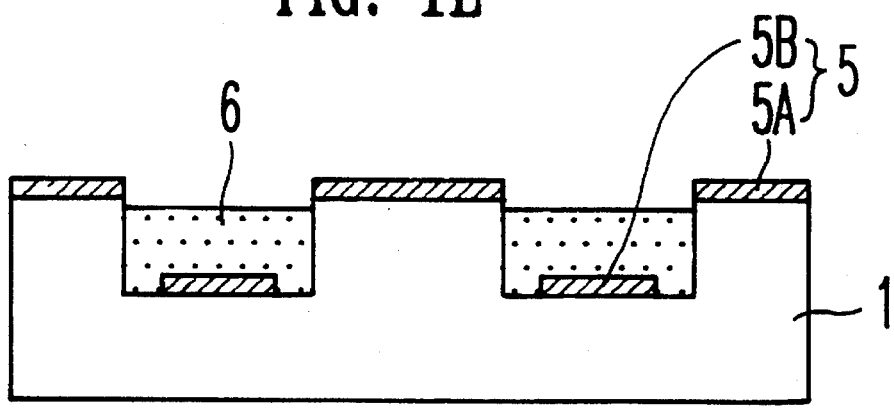

Referring to FIG. 1E, the spacers 4 are removed by an etching process and a photoresist is then coated on the resulting surface including both the chrome regions 5A and 5B and the etching groove 3. Thereafter, an etch-back process is performed to form the second photoresist pattern 6 at the groove 3 so as to expose only the upper chrome region 5A at the surface of the mask.

Figure 1F:
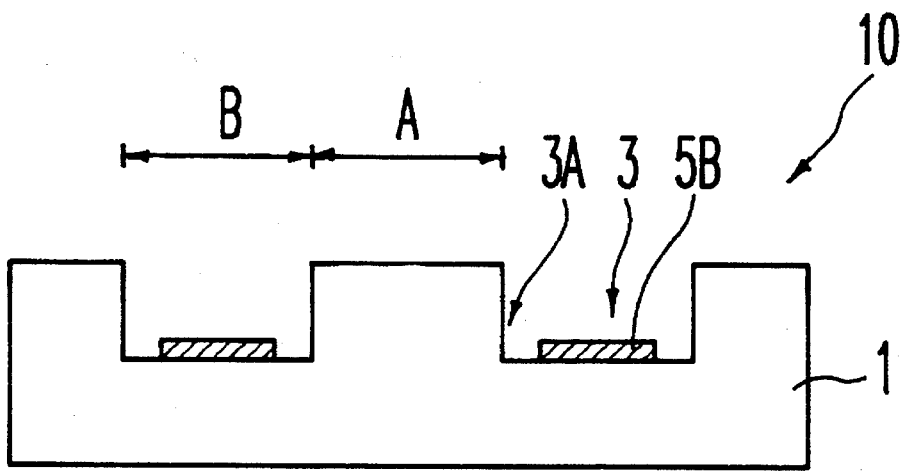

Referring to FIG. 1F, the upper chrome region 5A is removed by an etching process using the second photoresist pattern 6 as an etching mask, thereby forming the light transparent portion A of the phase shift mask. Thereafter, the second photoresist pattern 6 is removed so as to leave only the lower chrome region 5B, thereby forming the light shielding portion B of the phase shift mask. Accordingly, the phase shift mask 10 of the present invention is formed.

The phase shift mask 10 manufactured in accordance with above described process utilizes a principle creating a 180 degree phase shift at the etching surface of the etching groove 3.

Figure 2:
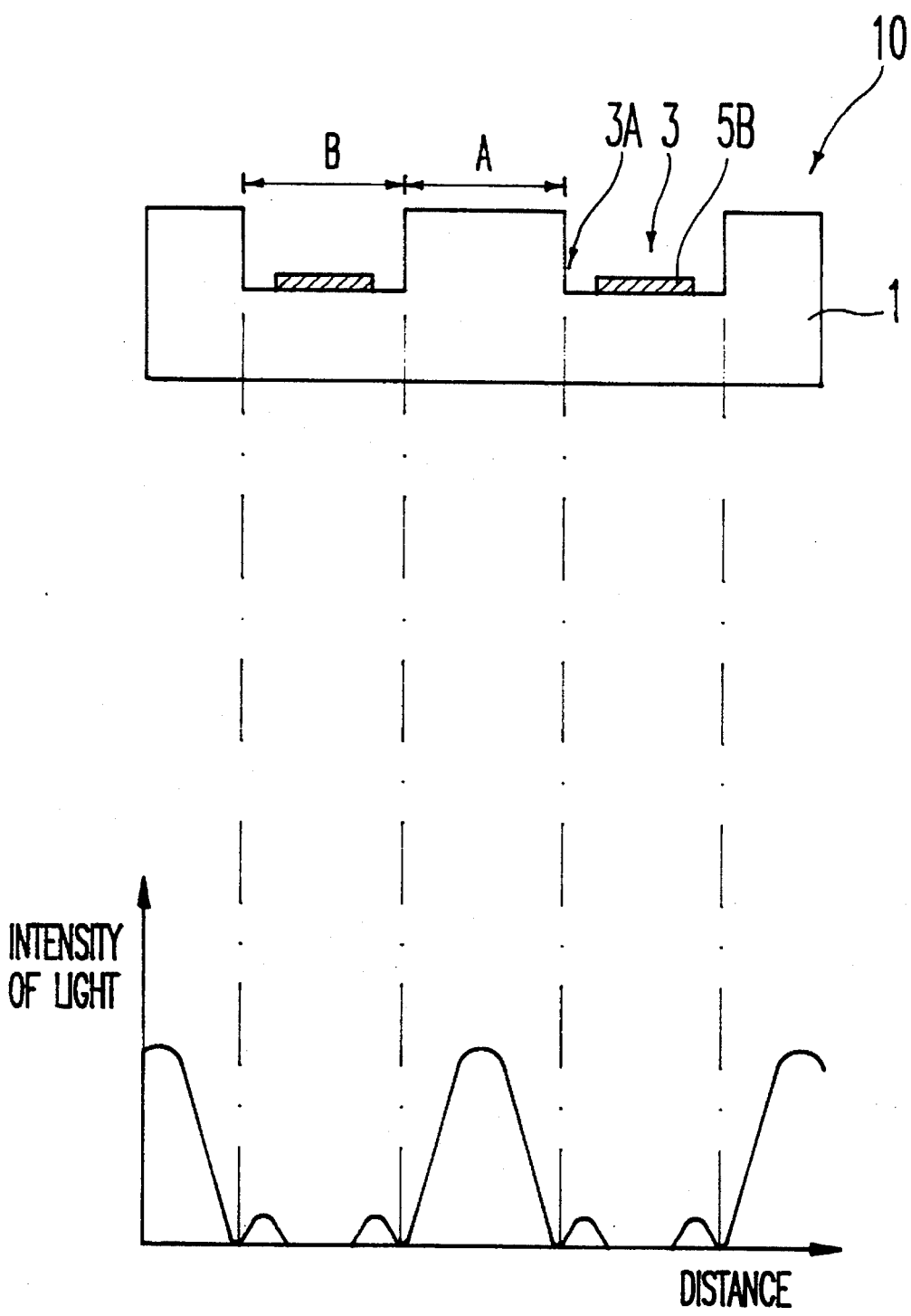
FIG. 2 illustrates the light intensity distribution of a phase shift mask according to the present invention.

As shown in FIG. 2, when light is emitted and transmitted to the phase shift mask 10, a 180 degree phase shift is created at the opening 3A, thereby reducing the light intensity to zero.

As described above, the phase shift mask of the present invention can produce a phase shift effect without using the phase shift materials. Furthermore, the phase shift mask can be effective using deep ultraviolet light having a short wavelength since the phase shift effect can be obtained by using a quartz substrate having high light transparency power properties. Also, the phase shift mask of the invention can be easily manufactured since phase shift materials are not necessary.

What is claimed is:

1. A method for fabricating a phase shift mask, comprising:

separating a light transparent portion and a light shielding portion on a quartz substrate;

forming an etching groove having side walls in said light shielding portion; and forming a chrome region on a bottom surface of said etching groove in a location such that openings are formed between said chrome region and said side walls.

2. The method of claim 1, wherein said etching groove is formed by an anisotropic etching process.

3. A phase shift mask having a light transparent portion and a light shielding portion disposed thereon, comprising:

a quartz substrate having an etching groove formed in said light shielding portion, wherein said etching groove having side walls; and a chrome region formed on a bottom surface of said etching groove in a way such that openings are formed between said chrome region and said side walls.

4. The phase shift mask of claim 3, wherein said etching groove is formed by an anisotropic etching process.

* * * * *